United States Patent
Schrödinger

(10) Patent No.: US 6,697,401 B1
(45) Date of Patent: Feb. 24, 2004

(54) LASER DRIVER AND DIGITAL CONTROLLER FOR A LASER DRIVER

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/330,941

(22) Filed: Dec. 27, 2002

(30) Foreign Application Priority Data

Oct. 29, 2002 (DE) .......................................... 102 50 982

(51) Int. Cl.⁷ ................................................. H01S 3/00
(52) U.S. Cl. .................................. 372/38.02; 369/59.11
(58) Field of Search ............................... 372/38.02, 38, 372/38.07, 29.02, 8; 369/53.2, 59.1, 59.11

(56) References Cited

U.S. PATENT DOCUMENTS

| | | | | |
|---|---|---|---|---|
| 4,592,057 A | * | 5/1986 | Comerford ..................... 372/8 |
| 4,612,671 A | * | 9/1986 | Giles ............................ 398/197 |
| 4,729,038 A | * | 3/1988 | Miura et al. ................. 358/300 |
| 5,081,631 A | * | 1/1992 | Dhurjaty ................... 372/38.07 |
| 6,483,791 B1 | * | 11/2002 | Asada et al. ............. 369/59.11 |
| 2001/0046243 A1 | * | 11/2001 | Schie ....................... 372/38.02 |
| 2002/0105982 A1 | * | 8/2002 | Chin et al. ................ 372/38.02 |
| 2002/0172242 A1 | * | 11/2002 | Seo .......................... 372/29.02 |
| 2002/0176461 A1 | * | 11/2002 | Nihei et al. ............... 372/38.02 |
| 2003/0151995 A1 | * | 8/2003 | Asada et al. ................ 369/53.2 |

* cited by examiner

Primary Examiner—Leon Scott, Jr.
(74) Attorney, Agent, or Firm—Laurence A. Greenberg; Werner H. Stemer; Ralph E. Locher

(57) ABSTRACT

A digital controller for a laser driver has a register for storing control data that serve to control an analog circuit of the laser driver. A first interface receives operating data from a local memory. A second interface receives external user data. A control unit controls the data communication between the first and second interfaces and the register. The digital controller thus takes over the trimming process and other communication and control functions of the laser driver. The required information for this is contained in the operating and/or user data.

13 Claims, 1 Drawing Sheet

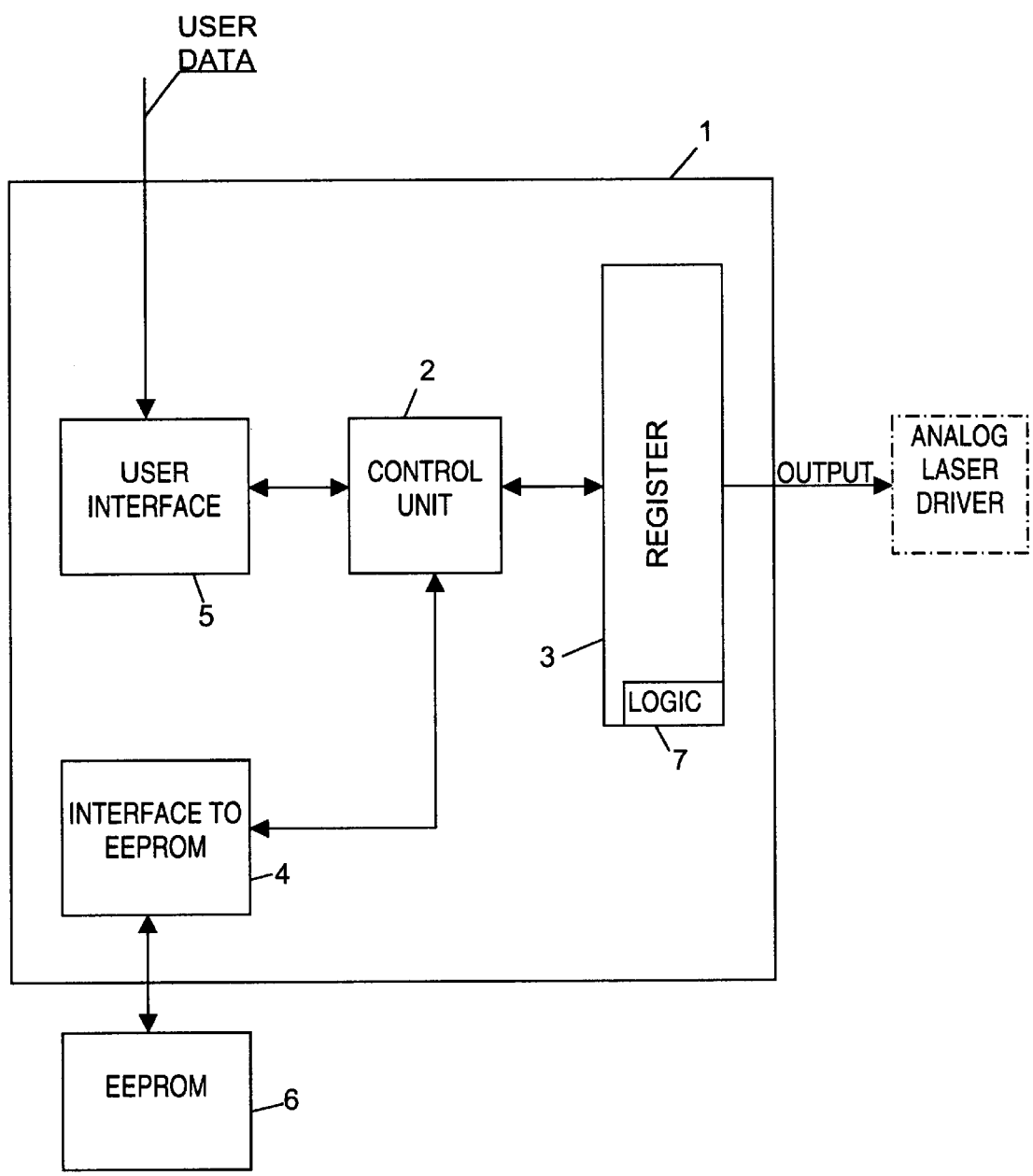

LASER DRIVER AND DIGITAL CONTROLLER FOR A LASER DRIVER

BACKGROUND OF THE INVENTION

Field of the Invention

The present application relates to a laser driver and a digital controller of a laser driver.

It is known how to trim a laser by soldering in resistors. This course of action is obviously difficult. Generally, the trimming and controlling of lasers by way of conventional laser drivers is not satisfactory.

SUMMARY OF THE INVENTION

It is accordingly an object of the invention to provide a laser driver and a digital laser driver control, which overcomes the above-mentioned disadvantages of the heretofore-known devices and methods of this general type and which make it possible to better control a laser. Specifically, a control system should be created which makes possible a user-friendly laser trimming.

With the foregoing and other objects in view there is provided, in accordance with the invention, a digital controller for a laser driver, comprising:

a register for storing control data serving to control an analog circuit of a laser driver;

a first interface for receiving operating data from a local memory and transmitting operating data to the local memory;

a second interface for receiving external user data; and a control unit connected between and controlling a communication of data between the first interface, the second interface, and the register.

In other words, a digital control of a laser driver is implemented, in accordance with the invention, with the following elements: a register for storing control data which serve for controlling an analog circuit of the laser driver; a first interface for receiving operating data from a local memory; a second interface for receiving external user data; and a control unit for controlling data communication between the first and second interfaces and the register.

The control unit is advantageously constructed for generating the control data with the aid of the received operating and/or user data, and storing the control data in the register.

In accordance with an added feature of the invention, the control unit is configured to transmit operating data received via the first interface into the register at predetermined events and/or a predetermined time.

In accordance with an additional feature of the invention, the control unit is configured to retrieve the operating data from the local memory via the first interface and to store the retrieved operating data in the register.

In accordance with another feature of the invention, the control unit is configured to retrieve and store operating data in response to a switching on of the digital controller and/or in response to a resetting of the digital controller.

In accordance with a further feature of the invention, a logic circuit is provided for comparing a parity byte contained in the operating or user data with a parity byte generated by the control unit, and wherein the control data are generated and stored in dependence on a result of a comparison in the logic circuit. In one implementation, the control unit causes a shut-down of the laser driver in case of non-matching parity bytes.

In a preferred embodiment, the logic circuit is integrated in the register.

That is, the digital control is provided in a laser driver for controlling a laser, with: such a system includes a local memory, which is connected to the first interface; and an analog circuit which is connected to an output of the register and which serves for controlling a laser according to the control data stored in the register.

The digital control can take over the trimming operation and other communication and control functions of the laser driver. The information needed for this is contained in the operating and/or user data.

The operating data are preferably prestored (and unmodifiable by the user) in the local memory (for instance by the manufacturer). In order to allow an influencing control or status interrogation by the user in spite of this, the second interface is provided. But the control unit which controls the communication between the interfaces and the register allows only conditional user access to the local memory.

There is therefore provided, in accordance with the invention, a laser driver for controlling a laser, comprising:

a digital controller as outlined above;

a local memory connected to the first interface; and an analog circuit connected to an output of the register for controlling a laser in accordance with the control data stored in the register.

In accordance with again an added feature of the invention, the control data contain information about trimming the laser, and the analog circuit is configured for trimming the laser according to the information.

In accordance with a concomitant feature of the invention, the control unit includes an interface for receiving a signal containing information about which of the data stored in one of the local memory and the register may be overwritten, and wherein the control unit is configured for overwrite only the data in one of the local memory and the register that may be overwritten according to the information contained in the signal.

Other features which are considered as characteristic for the invention are set forth in the appended claims.

Although the invention is illustrated and described herein as embodied in a laser driver and digital control of a laser driver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE is a schematic block diagram of a digital control system according to an exemplary embodiment of the invention.

DESCRIPTION OF THE PREFERRED EMBODIMENTS

Referring now to the FIGURE of the drawing in detail, the controller 1 is implemented as an integrated circuit, which comprises a control unit 2, a register 3, and first and second interfaces 4 and 5.

The first interface 4 is a serial communication interface, which forms an interface to a local memory 6. The local memory 6 may be an EEPROM or any such similar circuit that is capable of storing data long-term.

The second interface 5 is likewise a serial communication interface which serves as an interface to the user, who can communicate with the controller 1 across it. But the user can only communicate conditionally with the local memory 6. The manufacturer can determine which register is released for the user. Special security-related data and/or laser trimming data are preferably blocked.

A control unit 2 controls the data traffic between the serial interfaces 4 and 5 and a register 3. In particular, the control unit 2 effectuates a transmission of operating data from the local memory 6 into the register 3 at predetermined times or events. For instance, this can occur upon the powering up or resetting of the controller 1.

The register 3 represents the interface of the controller 1 to the analog block of a laser driver. The analog block of the laser driver takes over control tasks, temperature monitoring, laser security monitoring, and other service functions.

The register stores data for controlling the analog block, which can contain information about trim values for laser currents, power values of the laser, time constants, measurement values for laser currents, cut-off thresholds, and so on.

In particular, the data stored in the register 3 can contain information about an individual trimming of the allocated laser. When several such laser drivers are connected in parallel fashion, it is possible to carry out individual trimming of each allocated laser, respectively.

Fundamentally, laser security plays an important role in optical data communication. The data transfer across the interfaces 4 and 5 must therefore be secured. To that end, data that are received over the interfaces 4 and 5 contain a parity byte. At the same time, the control unit 2 generates a corresponding parity byte with each data transfer. A received parity byte is compared with the parity byte that is generated by the control unit 2 by way of a logic circuit 7. If the parity bytes do not match, security measures (e.g. shutting off the laser) can be taken.

In the exemplary embodiment represented in the figure, such a logic circuit 7 is provided in the register 3. If the comparison of the parity bytes in the logic circuit 7 does not produce a match, a storing of received data in the register 3 is prevented.

The interfaces 4 and 5 can be serial or parallel interfaces. A realization as serial interfaces is preferable, because the number of data lines is reduced but is sufficient for transmitting the relatively small data volumes. A suitable configuration for the interfaces 4 and 5 is the I$^2$C interface from Philips Semiconductors, for example.

Various protocols can be used for the data transfer between the interfaces 4 and 5 and the register 3, which is controlled by the control unit 2. The protocol for the data transfer preferably defines a signal containing information about which data can be written in register 3 and/or the local memory 6. Only the manufacturer should have access to this signal. For instance, security-related data such as data about laser trimming can be modified only by the manufacturer. On the other hand, other data can be modified by the user also, such as generally accessible settings of the controller 1 or production-related customer data.

It will be understood that the invention is not limited to the described exemplary embodiment but rather comprises modifications which come within the scope of protection as defined by the claims.

I claim:
1. A digital controller for a laser driver, comprising:
   a register for storing control data serving to control an analog circuit of a laser driver;
   a first interface for receiving operating data from a local memory and transmitting operating data to the local memory;
   a second interface for receiving external user data; and
   a control unit connected between and controlling a communication of data between said first interface, said second interface, and said register.

2. The digital controller according to claim 1, wherein said control unit is configured to generate the control data based on one of operating data and user data received thereby, and to store the control data in said register.

3. The digital controller according to claim 1, wherein said control unit is configured to transmit operating data received via said first interface into said register at predetermined events.

4. The digital controller according to claim 1, wherein one of the predetermined events is a predetermined time.

5. The digital controller according to claim 3, wherein said control unit is configured to retrieve the operating data from said local memory via said first interface and to store the retrieved operating data in said register.

6. The digital controller according to claim 5, wherein said control unit is configured to retrieve and store operating data in response to a switching on of the digital controller.

7. The digital controller according to claim 5, wherein said control unit is configured to retrieve and store operating data in response to a resetting of the digital controller.

8. The digital controller according to claim 1, which further comprises a logic circuit for comparing a parity byte contained in the operating or user data with a parity byte generated by said control unit, and wherein the control data are generated and stored in dependence on a result of a comparison in said logic circuit.

9. The digital controller according to claim 8, wherein said logic circuit is integrated in said register.

10. The digital controller according to claim 8, wherein said control unit causes a shut-down of the laser driver in case of non-matching parity bytes.

11. A laser driver for controlling a laser, comprising:
    a digital controller according to claim 1;
    a local memory connected to said first interface; and
    an analog circuit connected to an output of said register for controlling a laser in accordance with the control data stored in said register.

12. The laser driver according to claim 11, wherein the control data contain information about trimming the laser, and said analog circuit is configured for trimming the laser according to the information.

13. The laser driver according to claim 11, wherein said control unit includes an interface for receiving a signal containing information about which of the data stored in one of said local memory and said register may be overwritten, and wherein said control unit is configured for overwrite only the data in one of said local memory and said register that may be overwritten according to the information contained in the signal.

* * * * *